(12) United States Patent
Sivasubramaniam et al.

(10) Patent No.: US 6,728,647 B1
(45) Date of Patent: Apr. 27, 2004

(54) DETERMINATION OF CAPACITANCES OF INDIVIDUAL RESOURCES IN PROGRAMMABLE LOGIC DEVICES

(75) Inventors: Suresh Sivasubramaniam, San Jose, CA (US); Siuki Chan, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 294 days.

(21) Appl. No.: 09/792,134

(22) Filed: Feb. 21, 2001

(51) Int. Cl.[7] .............................................. G01R 27/00
(52) U.S. Cl. ......................................... 702/65; 324/681
(58) Field of Search .............................. 702/57, 64, 65, 702/75, 117, 118, 124, 126, 183, 189, FOR 103, FOR 106, FOR 134; 324/126, 539, 548, 681, 719, 727

(56) References Cited

U.S. PATENT DOCUMENTS 4,795,964 A * 1/1989 Mhant-Shetti et al. ...... 324/681
5,770,955 A * 6/1998 Reynolds ..................... 327/93
6,181,123 B1 * 1/2001 Jou et al. .................... 323/351
6,230,300 B1 * 5/2001 Takano ........................ 716/2

* cited by examiner

*Primary Examiner*—John Barlow
*Assistant Examiner*—Mohamed Charioui
(74) *Attorney, Agent, or Firm*—Louis D. Carter; Eric Hoffman; Justin Liu

(57) ABSTRACT

A method of estimating a capacitance of each resource in a programmable logic device (PLD) is described. The current drawn by a reference circuit implemented in the PLD is measured at a given frequency and operating voltage. The capacitance of the reference circuit is calculated using the current drawn, the frequency, and the operating voltage. The current drawn by a resource load coupled to the reference circuit is measured at the given frequency and operating voltage. The capacitance of the resource load coupled to the reference circuit is calculated using the current drawn, the frequency, and the operating voltage. The capacitance of the resource load may be calculated by subtracting the capacitance of the reference circuit from the capacitance of the resource load coupled to the reference circuit.

25 Claims, 5 Drawing Sheets

DETERMINATION OF CAPACITANCES OF INDIVIDUAL RESOURCES IN PROGRAMMABLE LOGIC DEVICES

FIELD OF THE INVENTION

The present invention relates to programmable logic devices. More specifically, the present invention relates to estimation of resource capacitances within a programmable logic device.

DISCUSSION OF RELATED ART

Logic devices may be roughly divided into two categories: fixed logic devices and programmable logic devices (PLDs). Fixed logic devices, such as microprocessors and application specific integrated circuits (ASICs), have internal logic fully determined at the end of the design cycle. The design reached at the end of the fixed logic device design cycle is implemented during fabrication into the fixed logic device. This implemented logic may be tested to measure the dynamic power required by the fixed logic device. Dynamic power is the power consumption of the logic device due to the switching of internal nodes and inputs and outputs in an active device. Because all fixed logic devices implementing the same design are identically fabricated, determining the dynamic power used by one fixed logic device provides an estimate of the dynamic power used by all fixed logic devices implementing the same design. As a result, fixed logic devices have a known range of dynamic power usage.

In contrast, the end of the design cycle of a PLD, such as a field programmable gate array (FPGA), occurs after the PLD is fabricated. Thus, while the programmable logic is implemented in the PLD at fabrication, a particular internal configuration logic of these PLDs is determined by a user after PLD fabrication. The internal logic of a PLD is defined by creating connections between the internal resources of the PLD (e.g. interconnect lines, look-up tables, and flip-flops). Additionally, with the advent of reprogrammability, the same PLD may have many different implemented designs at different times. Because different designs may be implemented in the logic within a PLD, the dynamic power required by the PLD may not be measured until the particular design to be implemented is defined and implemented in the PLD. Note that while it is possible to measure the power used by a particular design by standard means after a design is implemented within a PLD, it would be useful to obtain an estimation of power used by a particular design prior to the implementation of the design in the PLD. To this end, it would be desirable to provide a generic method that captures all the internal capacitances of the resources within a PLD for use with a tool to estimate power.

Power in a CMOS logic device is measured by the following equation:

$$P = C * V^2 * f \qquad \text{(Equation 1)}$$

where C is the capacitance of all of the resources within the logic device, V is the operating voltage of the logic device, and f is the operating clock frequency of the logic device.

In PLDS, a user may select different resources to form different designs, in addition to selecting the operating clock frequency for the design. For example, a first user design, created from a first set of PLD resources in a particular PLD may consume 10W of power while a second user design created from a second set of resources in that PLD may consume 20W of power. Thus, the power used by a PLD for a given design depends on the resources used by that design. Therefore, Equation 1 (the power equation) is modified for PLDs to measure power used by each resource, as shown by the following equation:

$$P = \sum_i C_i * V^2 * f \qquad \text{(Equation 2)}$$

where $C_i$ is the capacitance of the $i^{th}$ resource within the PLD, V is the operating voltage of the PLD, and f is the operating clock frequency of the PLD. Both the operating voltage and the operating clock frequency are determined by the user. Thus, only the capacitance of each resource within the PLD is unknown.

It would be desirable to provide a power estimating tool to generate the power analysis for a particular design implemented in a PLD. For example, a power estimator may be a piece of software which takes as parameters a design definition file (e.g. a .ncd file) and user parameters (e.g. operating frequency of the design) and in return provides an estimate of the power consumption of the PLD implementing that design. However, to estimate power in this way using Equation 2, the capacitance of each resource on the PLD used in the design must be known. The presence of PLD device packaging as well as the small scale of the silicon die precludes the direct measurement of the capacitance of individual PLD resources. Thus, a tool estimating power in a PLD according to Equation 2 first requires a capacitance of each resource used for a particular design within the PLD. Thus, it would be desirable to provide a method for estimating capacitances within a PLD to serve as a basis for such a power estimating tool.

SUMMARY

Accordingly, the present invention provides a method of estimating a capacitance for each quantifiable resource in a programmable logic device (PLD). Note that because some resources in a PLD are always instantiated together, these co-instantiated resources are grouped as one resource for the purpose of determining capacitance. The current drawn by a reference circuit implemented in the PLD is measured at a given frequency and operating voltage. The capacitance of the reference circuit is calculated using the current drawn, the frequency, and the operating voltage. The current drawn by a resource load coupled to the reference circuit is measured at the given frequency and operating voltage. The capacitance of the resource load coupled to the reference circuit is calculated using the current drawn, the frequency, and the operating voltage. The capacitance of the resource load may be calculated by subtracting the capacitance of the reference circuit from the capacitance of the resource load coupled to the reference circuit. Each resource within the PLD may be sequentially used as a resource load, thereby determining the capacitance of each resource within the PLD as described above.

To ensure that the currents drawn by the reference circuit and the resource load coupled to the reference circuit are sufficiently large enough to measure, multiple identical reference circuits may be implemented in the PLD. Using multiple identical reference circuits, a proportionally larger total current is drawn. As a result, noise margins and resolution are improved in the power calculation. The total current drawn by all of the reference circuits, along with the frequency and the operating voltage, is used to determine a total reference circuit capacitance. This total reference circuit capacitance is divided by the number of reference circuits to estimate a capacitance for each individual reference circuit. Similarly, multiple identical loads are coupled to the reference circuit, respectively. The total current drawn by all of the reference circuits plus the loads (i.e., loaded reference circuit) is measured and used to determine a total loaded reference circuit capacitance. The capacitance of one loaded reference circuit is estimated by subtracting the total reference circuit capacitance from the total loaded reference circuit capacitance and dividing by the number of reference circuits.

The present invention will be more fully understood in view of the following description and drawings.

BRIEF DESCRIPTION OF THE DRAWINGS

Similar elements in FIGS. 1–4C are labeled similarly.

DETAILED DESCRIPTION

Figure 1:
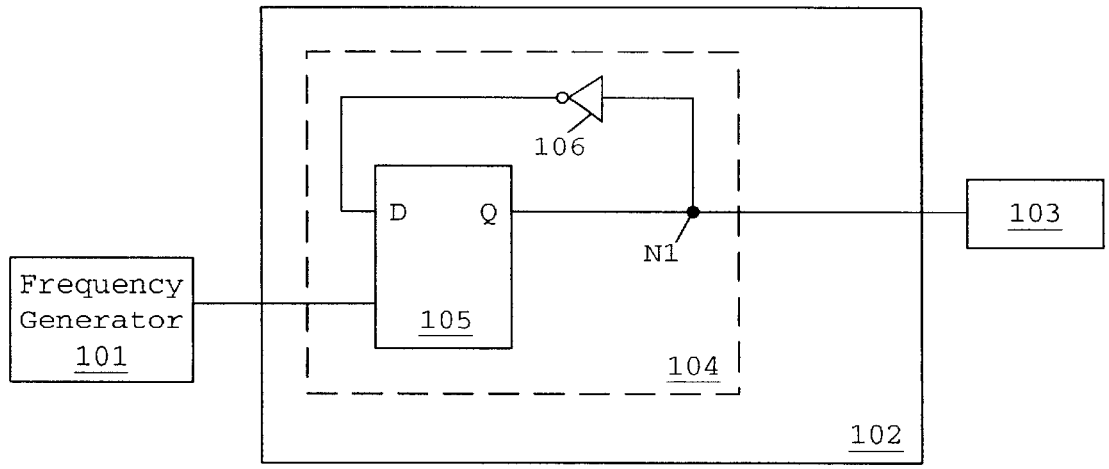
FIG. 1 is a schematic diagram of a reference circuit within a PLD in accordance with an embodiment of the present invention.

The capacitance of each resource within a PLD is estimated to provide a basis for estimating the power used by a design to be implemented in the PLD. Having known capacitances for each resource allows this power estimation to occur at the design phase rather than after implementation. A given design implemented in a PLD can use any of the resources on the PLD if the use of that resource does not violate a design rule of the PLD. Because any resource on a PLD is available for use in a design, a power estimating tool operating on the design estimates power used on a resource by resource basis. One method to estimate power used on a resource by resource basis is to estimate the capacitance of each resource and use those capacitances in the power equation (Equation 2). The estimated capacitance for each resource in a PLD is stored in a file along with the associated resource name. In this way, any resource found in a user design definition file has an associated capacitance available for use in the power estimation tool. When making this information available to a power estimator, the capacitance of each resource in the PLD is estimated.

Power, defined in Equations 1 and 2, is also defined as:

$$P = V*I \quad \text{(Equation 3)}$$

where I is the current. Combining Equation 3 with Equation 1, we get:

$$I = C*V*f \quad \text{(Equation 4)}$$

Equation 4 assumes that the current increases linearly with frequency for a given operating voltage and capacitance. Therefore, the linear increase of current with frequency is verified with a number of frequencies when using this equation to validate this assumption. Rearranging Equation 4 to solve for capacitance, we get:

$$C = \frac{I}{V*f} \quad \text{(Equation 5)}$$

Note that Equation 5 includes the crossbar current component, which is typically very small. Crossbar current is the simultaneous switching current. Equation 5 also accounts for quiescent current. Quiescent current is the current drawn by the PLD when powered on but prior to operation. The quiescent currents will be explained in more detail later with respect to FIG. 3 below.

A method of capacitance estimation according to the present invention is a two stage process. In the first stage of the process, a reference logic circuit is implemented using resources of the PLD. The capacitance of the reference logic circuit may be estimated by fixing the operating voltage used by this reference logic circuit and solving Equation 5 for a number of operating frequencies. The current is plotted versus a multiple of operating frequencies to ensure that the linearity assumption made in Equation 4 is valid.

In the second stage of the process, an additional resource in the PLD is added as a load on the reference logic circuit. The capacitance of the reference logic circuit plus the resource load may be estimated by fixing an operating voltage for this loaded reference logic circuit and solving Equation 5 for a number of operating frequencies. Again, the multiple of operating frequencies are used to ensure that the linearity assumption made in Equation 4 is valid.

The capacitance of the resource load may be calculated as the capacitance of the reference logic circuit plus the resource load less the capacitance of the reference logic circuit. As a result, the capacitance of the particular resource used as the load is estimated despite the inability to directly measure the capacitance of the resource used as the load due to PLD device packaging and the small scale of the silicon die. By applying this loading process to each resource in the PLD, the capacitance of each resource may be estimated. This process is described in more detail below.

In one embodiment, the resources of a Field Programmable Gate Array (FPGA) are estimated. FPGAs typically comprises one or more configurable logic blocks (CLBs), input/output blocks (IOBs), and interconnect lines. Each of these may be further subdivided into a set of resources. For example, each CLB in a particular FPGA may include a multiplexer, a flip-flop, and a look-up table (LUT). Interconnect lines may include long lines, hex lines, or some other length line. Each IOB may include a multiplexer and a flip-flop. In accordance with the present invention, each of these resources (e.g. mulitiplexers, LUTs, lines) can be applied as resource loads to the reference circuit to estimate their capacitance.

FIG. 1 is a block diagram of a reference circuit 104 according to one embodiment of the present invention. Reference circuit 104 includes a flip-flop 105 and an inverter 106 coupled such that an output signal from flip-flop 105 is applied to an input terminal of inverter 106 and an output signal from inverter 106 is applied to an input terminal of flip-flop 105. The output signal from flip-flop 105 is also applied to node N1. Flip-flop 105 is implemented in a PLD 102, and is clocked by a frequency generator 101. Frequency generator 101 is any generic frequency generator, for example a Hewlett Packard 81110A frequency generator may be used. Because flip-flop 105 is configured in an inverted feedback configuration through inverter 106, reference circuit 104 acts as a clocked oscillator that operates at half the clock frequency generated by frequency generator 101.

Current consumed by reference circuit 104 is measured by a current measuring device 103. Current measuring device 103 may be any generic current measuring device. For example, a Hewlett Packard 3631A power supply may be used. The current consumed by reference circuit 104 is measured at several frequencies provided by frequency generator 101 to verify the linearity assumption described above.

Figure 2:
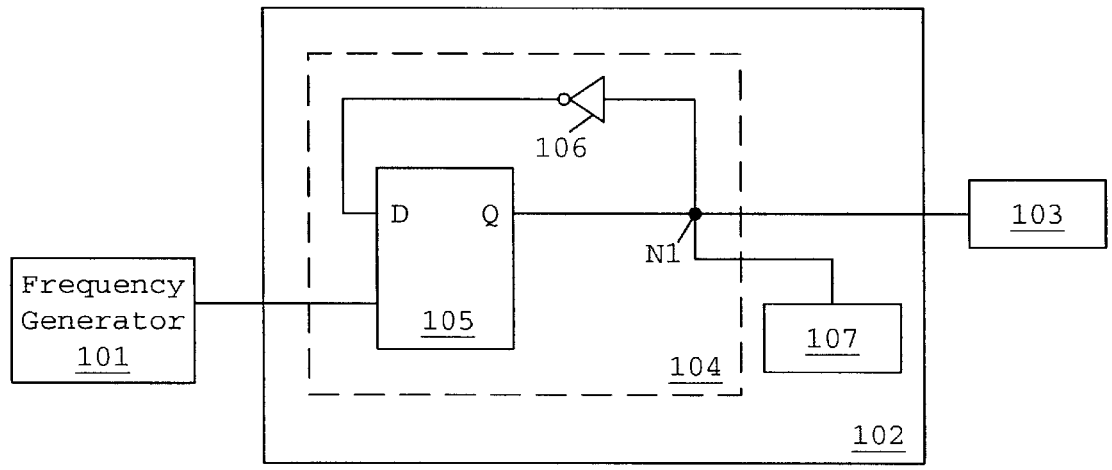
FIG. 2 is a schematic diagram of a reference circuit having a resource load within a PLD in accordance with an embodiment of the present invention.

FIG. 2 is a block diagram of a composite circuit including a reference circuit and a resource load according to one embodiment of the present invention. Reference circuit 104 is configured as described with respect to FIG. 1. Resource load 107 is coupled to reference circuit 104 at node N1. Note that resource load 107 may include one or more resources on PLD 102. The combination of reference circuit 104 and load 107 is referred herein as a composite circuit. Current consumed by both reference circuit 104 and resource load 107 is measured by current measuring device 103. The current consumed by reference circuit 104 and resource load 107 is measured at several frequencies from frequency generator 101 to verify the linearity assumption described above.

Figure 3:
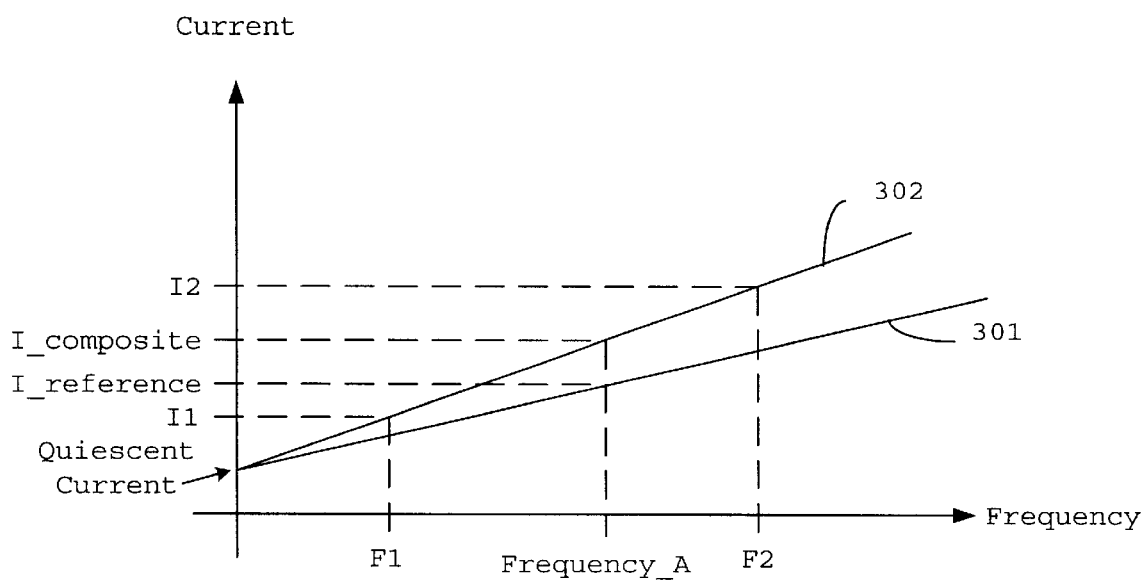
FIG. 3 is a theoretical graph of the relationship between current and frequency for a reference circuit having a resource load within a PLD in accordance with an embodiment of the present invention.

FIG. 3 is a theoretical graph plotting current versus frequency from the circuits of FIGS. 1 and 2. The theoretical current drawn by reference circuit 104 alone is plotted as line 301 for a number of frequencies. As shown, line 301 is a straight line, thereby validating the linearity assumption of Equation 4. Similarly, the theoretical current drawn by both reference circuit 104 and load 107 is plotted as line 302 for a number of frequencies. Because line 302 is also a straight line, the linearity assumption of Equation 4 is validated for this circuit as well. Note that quiescent current is eliminated in these calculations because the capacitance is derived from the slope of the current versus frequency plot. Quiescent current is the current drawn by the PLD when powered on but prior to operation.

Equation 5 is solved for a given frequency for both the reference and composite circuits. For example, the capacitance of the reference load, $C\_reference$, is equivalent to the current $I\_reference$ divided by the frequency $Frequency\_A$ times the operating voltage of the reference circuit. However, this method does not guarantee elimination of quiescent current.

Alternatively, the slope of a line (e.g., line 302) is preferably used to determine $C\_composite$. For example, the slope of line 302 is equivalent to $(I2-I1)/(F2-F1)$. The capacitance of the composite circuit (represented by line 302) is thus $(I2-I1)/(V*(F2-F1))$. Similarly, the slope of line 301 may be used to determine $C\_reference$. The frequency used to determine $C\_reference$ does not need to be the same frequency as that used to determine C composite.

The capacitance of the composite circuit, $C\_composite$, is equivalent to the capacitance of reference circuit 104, $C\_reference$, plus the capacitance of load 107, $C\_load$, as shown below.

$$C\_composite = C\_reference + C\_load \quad \text{(Equation 6)}$$

Rearranging Equation 6 to solve for the capacitance of load 107, $C\_load$ is equivalent to $C\_composite$ less $C\_reference$, as shown below.

$$C\_load = C\_composite - C\_reference \quad \text{(Equation 7)}$$

This calculation may be made with several different loads to determine the capacitance of each resource on PLD 102. As noted above, when resources are not separately accessible, they may be combined into one load for the purpose of determining a combined capacitance.

Because some resources on PLD 102 require a path through other resources for access, the capacitance must be calculated as a series of loads. For example, $$C\_composite = C\_reference + C\_load1 + C\_load2 \quad \text{(Equation 8)}$$

where $C\_load1$ is the first in the series of loads and $C\_load2$ is the second in the series of loads. In this case, $C\_load2$ is calculated by rearranging Equation 8 to be $$C\_load2 = C\_composite - C\_reference - C\_load1 \quad \text{(Equation 9)}$$

The calculation of capacitance of resources requiring a path through other resources for access is described in more detail below.

Once each resource on a programmable logic device has been estimated, that information is stored (e.g., in a table) to be accessed by a power estimator. Once a design is completed for a programmable logic device, the power consumed for each resource used in the design may be calculated using this stored information, the operating voltage, the operating frequency, and Equation 2. In this way, the power used by a design to be implemented in a programmable logic device may be estimated.

Figure 4A:
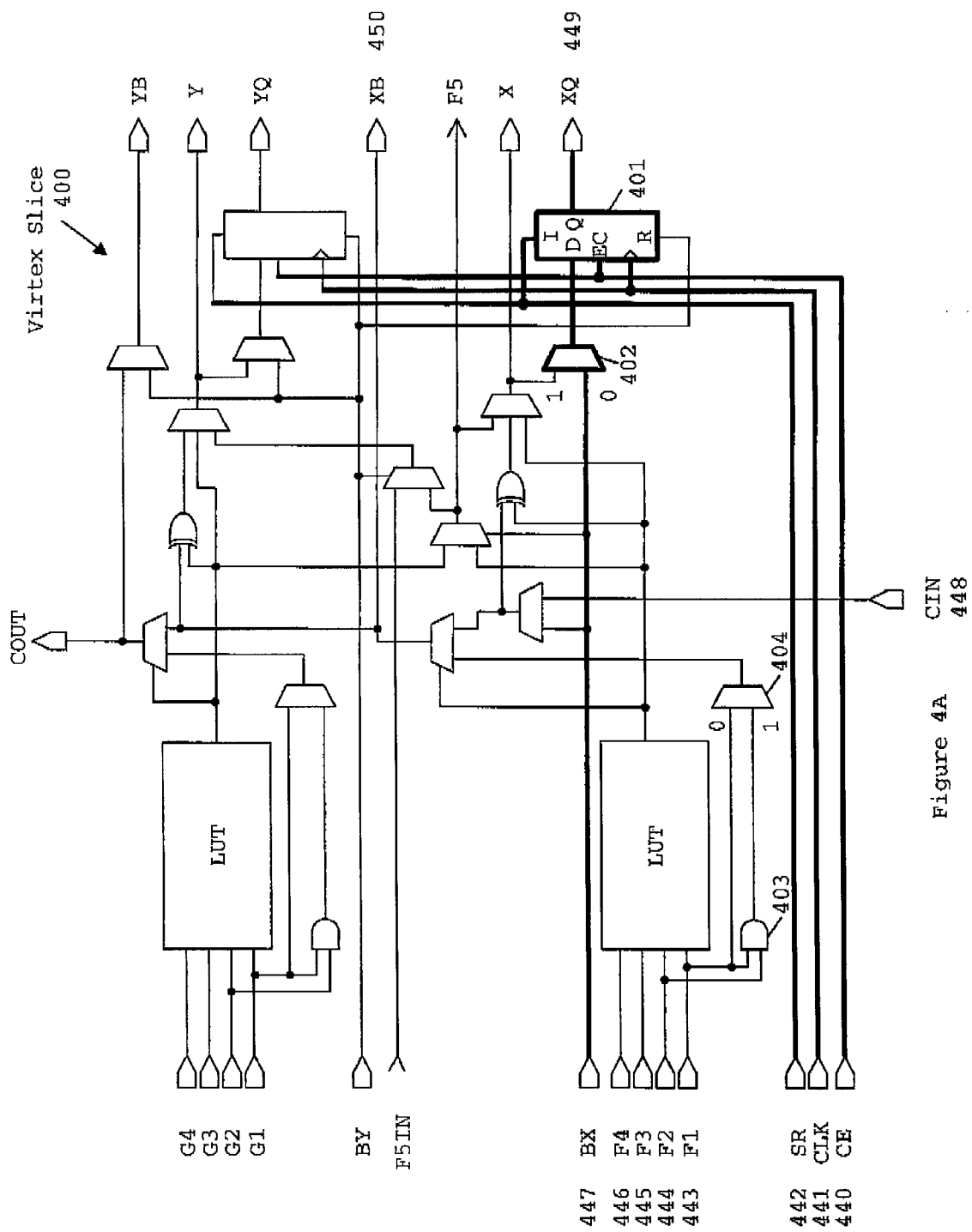
FIG. 4A is a simplified schematic diagram of a Virtex slice implementing a reference circuit in accordance with an embodiment of the present invention.

FIG. 4A is a simplified schematic diagram of a Virtex slice 400 according to an embodiment of the present invention. A reference circuit similar to reference circuit 104 of FIG. 1 is configured in Virtex slice 400 as shown by the darkened lines. This highlighted reference circuit includes flip-flop 401 and multiplexer 402. Flip-flop 401 receives a logic "0" value applied to SR input pad 442 at an initialization terminal I and a logic "1" value applied to CE input pad 440 at an enable clock terminal EC. These logic values applied to initialization terminal I and enable clock terminal EC of flip-flop 401 indicates that flip-flip 401 is past the initialization phase and the clock signal applied to flip-flop 401 is enabled, respectively. Flip-flop 401 is clocked by a signal from a frequency generator (not shown) similar to frequency generator 101 of FIG. 1 applied to CLK input pad 441. The data output terminal Q of flip-flop 401 at XQ output pad 449 is coupled to BX input pad 447 externally to Virtex slice 400. This signal at BX input pad 447 is applied to the inverting terminal of multiplexer 402. The output terminal of multiplexer 402 is coupled to the data input terminal of flip-flop 401. In this way, a circuit similar to reference circuit 104 (FIG. 1) is implemented in Virtex slice 400.

The current drawn by the highlighted reference circuit is measured by a current measuring device (not shown) similar to current measuring device 103 (FIG. 1). Several operating frequencies are used to check the validity of the linearity assumption of Equation 4. Once the linearity assumption of Equation 4 is validated, the capacitance of the reference circuit ($C\_reference$) may be calculated using Equation 5.

Figure 4B:
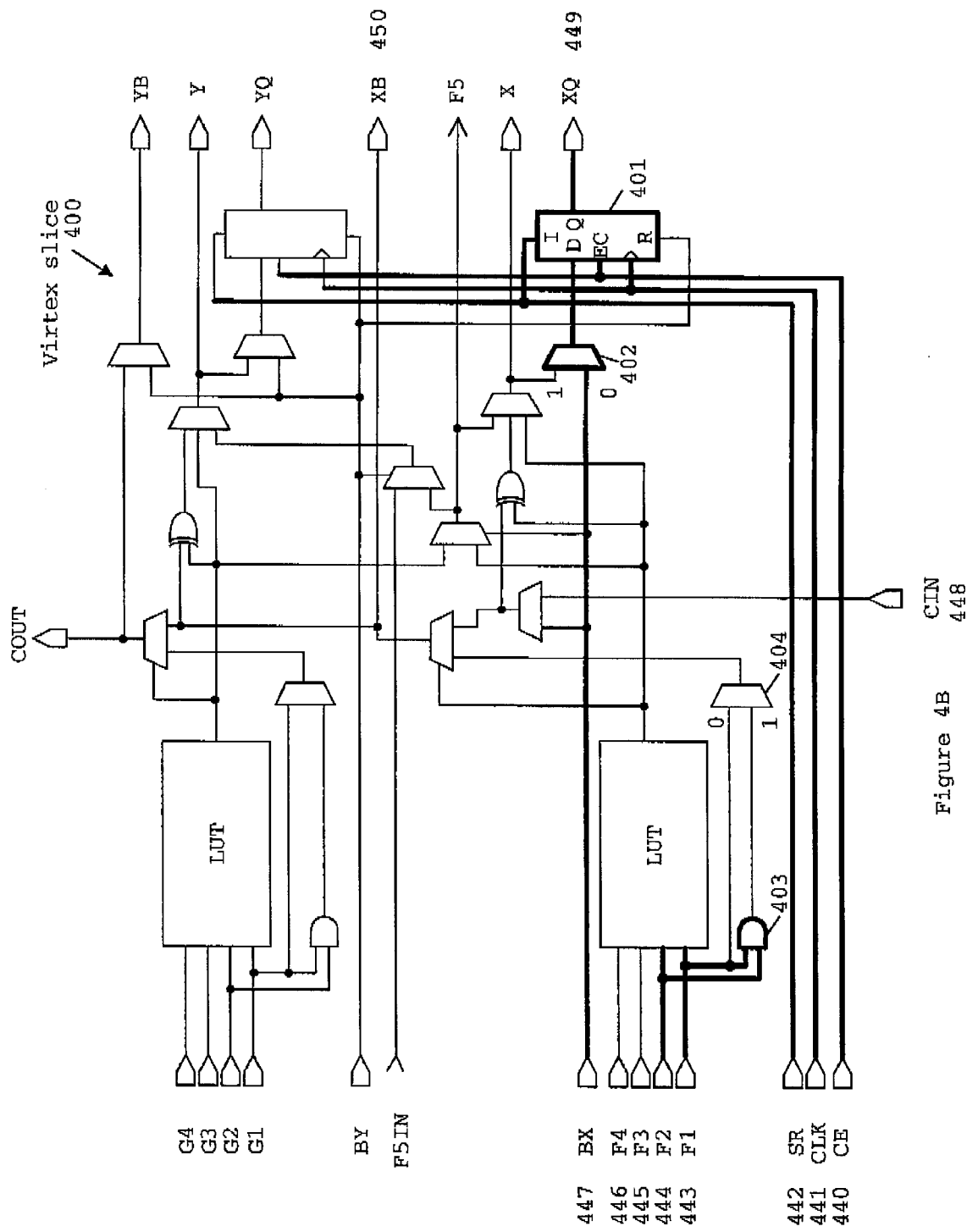
FIG. 4B is a simplified schematic diagram of a Virtex slice implementing a reference circuit having a first resource load in accordance with an embodiment of the present invention.

FIG. 4B is a simplified schematic diagram of a Virtex slice 400 according to the embodiment of FIG. 4A. A first load including AND gate 403 has been highlighted in Virtex slice 400, creating a first composite circuit including the reference circuit and AND gate 403. Logic values are applied to input pads 443 and 444. To provide the worst-case measure of capacitance, the logic values applied to input pads 443 and 444 oscillate between a logic "0" value and a logic "1" value. For example, in one embodiment, the clock signal applied to input pad 441 is also applied to input pads 443 and 444. Note that the worst-case measure of capacitance is made by applying an oscillating signal to the resources, thereby providing a 100% toggle rate on inputs. The oscillating inputs provide a charge and discharge cycle for capacitance measurement.

The current drawn by the highlighted first composite circuit is measured at XQ output pad 449 by a current measuring device (not shown) similar to current measuring device 103 (FIG. 1). Several operating frequencies are used to check the validity of the linearity assumption of Equation 4. Once the linearity assumption of Equation 4 is validated, the capacitance of the first composite circuit (C_composite1) may be calculated using Equation 5.

To calculate the capacitance of the first load C_load1 (i.e., AND gate 403), Equation 7 is used. Thus, the capacitance of the first load, C_load1 is equal to C_composite1 less C_reference.

Figure 4C:
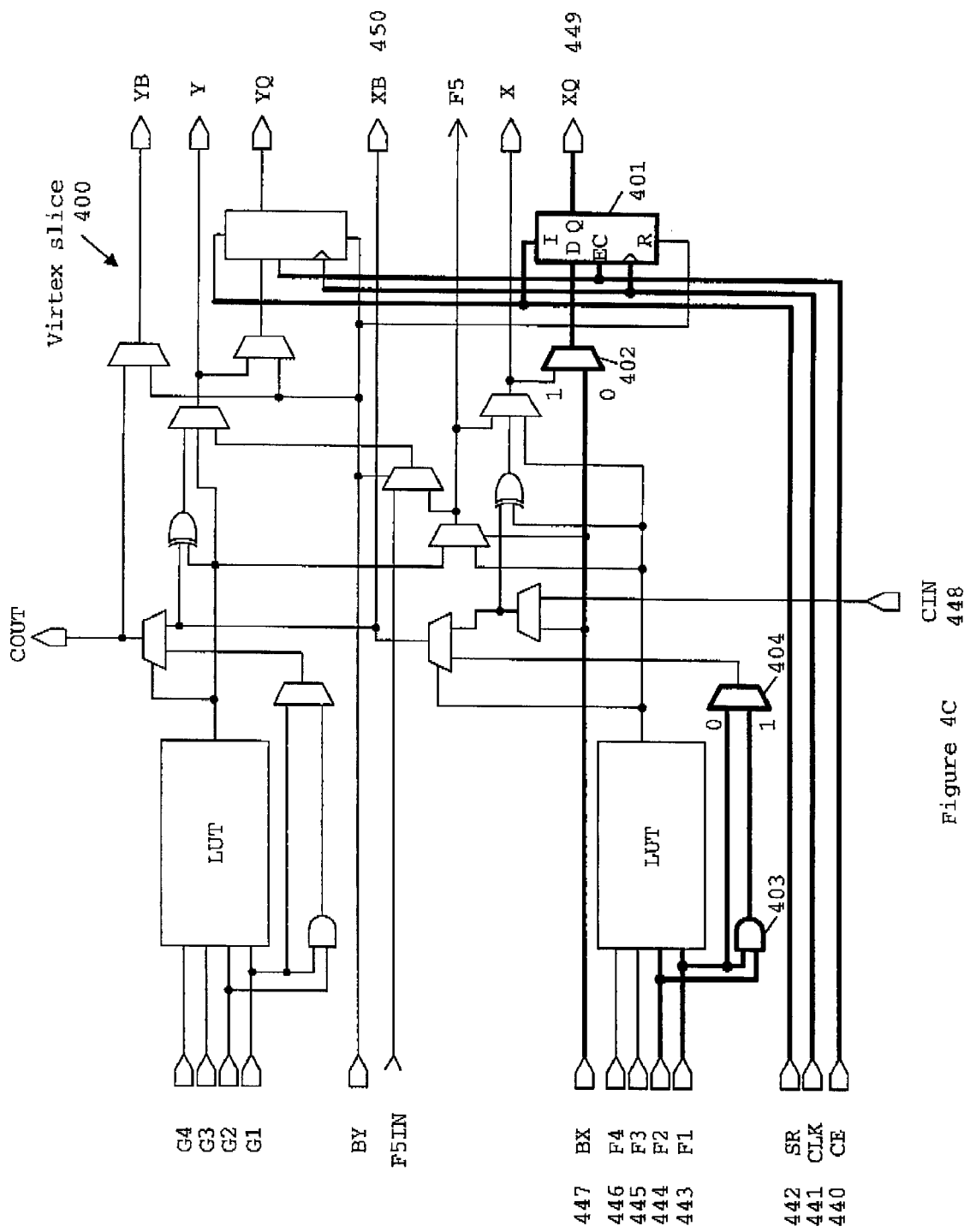
FIG. 4C is a simplified schematic diagram of a Virtex slice implementing a reference circuit having a second resource load in accordance with an embodiment of the present invention.

FIG. 4C is a simplified schematic diagram of Virtex slice 400 according to the embodiment of FIG. 4B. A second load including multiplexer 404 has been highlighted in Virtex slice 400, creating a second composite circuit that includes the reference circuit, AND gate 403, and multiplexer 404.

The current drawn by the highlighted second composite circuit is measured at XQ output pad 449 by a current measuring device (not shown) similar to current measuring device 103 (FIG. 1). Several operating frequencies are used to check the validity of the linearity assumption of Equation 4. Once the linearity assumption of Equation 4 is validated, the capacitance of the second composite circuit (C_composite2) may be calculated using Equation 5.

To calculate the capacitance of the second load C_load2 (i.e., multiplexer 404), Equation 9 is used. Thus, the capacitance of the second load, C_load2 is equal to C_composite2 less C_reference less C_load1. In this way, the capacitance of each resource in Virtex slice 400 may be estimated by adding each resource as a load and calculating the difference in capacitance of the resulting circuit and the circuit without that load. Note that resources external to Virtex slice 400 may also be coupled to the reference circuit to obtain estimated capacitance values. Equation 9 is used because multiplexer 404 can not be added as a load to the reference circuit without adding AND gate 403. Thus, to determine the capacitance of multiplexer 404 (C_load2), the capacitance of the both the reference circuit (C_reference) and the capacitance of AND gate 403 (C_load1) must be used.

Small current changes are sometimes difficult to detect. Because an individual reference circuit may draw small currents and added loads may provide only slightly larger current draw, multiple identical reference circuits may be used. Thus, as described above, the resolution and noise margins of the capacitance estimation are improved by implementing multiple identical reference circuits. Resolution of a circuit is the accuracy with which an attribute of the circuit is measured. For example, a reference circuit may be implemented in a number of configurable logic blocks within a PLD. The total current drawn by all of the reference circuits may be used to determine a total capacitance. This capacitance may be divided by the number of reference circuits implemented in the configurable logic blocks to determine an average capacitance for each reference circuit. Similarly, multiple identical loads may be used wherein each load is added to a reference circuit implemented in the number of configurable logic blocks. The total current drawn by all of the loaded reference circuits (i.e., each reference circuit plus load combination) to determine a total loaded capacitance. This total loaded capacitance may be divided by the number of loaded reference circuits implemented in the configurable logic blocks to determine an average capacitance for each loaded reference circuit. To determine the capacitance of the load, the average capacitance for each reference circuit is subtracted from the average capacitance for each loaded reference circuit.

Although the invention has been described in connection with the present embodiments, it is understood that this invention is not limited to the embodiment disclosed, but is capable of various modifications which would be apparent to a person skilled in the art. For example, different embodiments may have different input values. While worst case provides the best estimate of capacitance, it is possible to apply varying input values and varying toggle rates to estimate the capacitance. Similarly, the current capacitance estimating techniques may be applied to other programmable logic devices, limited only by the architecture and the detail of resource selection. Thus, the invention is limited only by the following claims.

What is claimed is:

1. A method of determining a capacitance of a resource in a programmable logic device (PLD), the method comprising:

implementing a reference circuit in the PLD by configuring resources of the PLD that are used during normal operation of the PLD;

coupling a frequency generator to a clocking input of the reference circuit;

operating the reference circuit at a first operating voltage;

measuring a first current drawn by the reference circuit at a first frequency; and calculating a first reference capacitance using the first current, the first frequency, and the first operating voltage.

2. The method of claim 1, further comprising:

configuring resources of the PLD to couple a first resource load to the reference circuit, thereby creating a first composite circuit;

operating the first composite circuit at a second operating voltage;

measuring a fourth current drawn by the first composite circuit at a fourth frequency; and calculating a first composite capacitance using the fourth current, the fourth frequency, and the second operating voltage.

3. The method of claim 2, further comprising: subtracting the first reference capacitance from the first composite capacitance to obtain a capacitance of the first resource load.

4. The method of claim 3, further comprising:

configuring a resource of the PLD to couple a second resource load to the first composite circuit, thereby creating a second composite circuit;

operating the second composite circuit at a third operating voltage;

measuring a seventh current drawn by the second composite circuit at a seventh frequency; and calculating a second composite capacitance using the seventh current, the seventh frequency, and the third operating voltage.

5. The method of claim 4, wherein the third operating voltage is equivalent to the second operating voltage.

6. The method of claim 4, further comprising:

subtracting the first composite capacitance from the second composite capacitance to obtain a capacitance of the second resource load.

7. The method of claim 4, further comprising:
measuring an eighth current drawn by the second composite circuit at a eighth frequency;
measuring a ninth current drawn by the second composite circuit at a ninth frequency; and
verifying that a linear relationship exists between the seventh current at the seventh frequency, the eighth current at the eighth frequency, and the ninth current at the ninth frequency.

8. The method of claim 2, wherein the second operating voltage is equivalent to the first operating voltage.

9. The method of claim 2, further comprising:
measuring a fifth current drawn by the first composite circuit at a fifth frequency;
measuring a sixth current drawn by the first composite circuit at a sixth frequency; and
verifying that a linear relationship exists between the fourth current at the fourth frequency, the fifth current at the fifth frequency, and the sixth current at the sixth frequency.

10. The method of claim 2, wherein the first resource load is a look-up table.

11. The method of claim 2, wherein the first resource load is an interconnect line.

12. The method of claim 2, wherein the first resource load is a hex line.

13. The method of claim 2, wherein the first resource load is a flip-flop.

14. The method of claim 2, wherein the first resource load is a multiplexer.

15. The method of claim 2, wherein the first resource load is a resource within a configurable logic block.

16. The method of claim 2, wherein the first resource load is a resource within an input/output block.

17. The method of claim 2, wherein the first resource load is a resource within a block of interconnect lines.

18. The method of claim 1, further comprising:
measuring a second current drawn by the reference circuit at a second frequency;
measuring a third current drawn by the reference circuit at a third frequency; and
verifying that a linear relationship exists between the first current at the first frequency, the second current at the second frequency, and the third current at the third frequency.

19. The method of claim 18, further comprising:
determining a slope of the linear relationship, which is equal to the difference between the first current and the second current, divided by the difference between the first frequency and the second frequency; and
calculating the first reference capacitance as the product of the slope and the first operating voltage.

20. The method of claim 1, wherein the reference circuit is implemented by coupling an output terminal of a flip-flop to an input terminal of the flip-flop through an inverter element.

21. A method of determining a capacitance of a resource in a programmable logic device (PLD), the method comprising:
implementing a plurality of reference circuits by configuring resources of the PLD, wherein each of the reference circuits is located in a corresponding configurable logic block the PLD;
coupling a frequency generator to a clocking input of the each reference circuit;
operating each reference circuit at a first operating voltage;
measuring a first total current drawn by all of the reference circuits at a first frequency;
calculating a first total capacitance using the first total current, the first frequency, and the first operating voltage; and
calculating a first reference capacitance using the first total capacitance divided by a total number of reference circuits.

22. The method of claim 21, further comprising:
configuring resources of the PLD to add a plurality of identical first resource loads, wherein each of the first resource loads is coupled to a corresponding reference circuit, thereby creating a plurality of first composite circuits;
operating the first composite circuits at a second operating voltage;
measuring a fourth total current drawn by the first composite circuits at a fourth frequency;
calculating a first total composite capacitance using the fourth total current, the fourth frequency, and the second operating voltage; and
calculating a first composite capacitance using the first total capacitance divided by the number of first composite circuits.

23. The method of claim 22, wherein the second operating voltage is equivalent to the first operating voltage.

24. The method of claim 22, further comprising:
subtracting the first reference capacitance from the first composite capacitance to obtain a capacitance of the first resource load.

25. The method of claim 21, further comprising:
measuring a second total current drawn by all of the reference circuits at a second frequency;
measuring a third total current drawn by all of the reference circuits at a third frequency; and
verifying that a linear relationship exists between the first total current at the first frequency, the second total current at the second frequency, and the third total current at the third frequency.

* * * * *